United States Patent
Broeckmann

(10) Patent No.: US 11,275,102 B2
(45) Date of Patent: Mar. 15, 2022

(54) METHOD FOR MONITORING A GROUND RESISTANCE OF AN ELECTRIC INSTALLATION

(71) Applicant: Bender GmbH & Co. KG, Gruenberg (DE)

(72) Inventor: Eckhard Broeckmann, Giessen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 0 days.

(21) Appl. No.: 17/164,874

(22) Filed: Feb. 2, 2021

(65) Prior Publication Data

US 2021/0255225 A1    Aug. 19, 2021

(30) Foreign Application Priority Data

Feb. 4, 2020  (DE) ...................... 10 2020 102 726.5

(51) Int. Cl.
  *G01R 27/20*   (2006.01)
  *G01R 31/52*   (2020.01)
  *G01R 27/18*   (2006.01)

(52) U.S. Cl.
  CPC ........... *G01R 27/205* (2013.01); *G01R 27/18* (2013.01); *G01R 31/52* (2020.01)

(58) Field of Classification Search
  CPC ...... G01R 27/205; G01R 27/20; G01R 27/18; G01R 31/54; G01R 31/52
  See application file for complete search history.

(56) References Cited

U.S. PATENT DOCUMENTS

| 2013/0221976 | A1* | 8/2013 | Blumschein | ......... G01R 31/088 324/509 |
| 2017/0059641 | A1* | 3/2017 | Loucks | ............... H02J 13/0004 |
| 2019/0128944 | A1* | 5/2019 | Englert | ................ G01R 31/085 |

FOREIGN PATENT DOCUMENTS

| DE | 102013209142 A1 | 5/2013 |
| DE | 102012019094 A1 | 3/2014 |
| DE | 102013209142 A1 | 11/2014 |
| DE | 102016202021 B3 | 2/2016 |
| DE | 102016202021 B3 | 3/2017 |

* cited by examiner

*Primary Examiner* — Dominic E Hawkins
(74) *Attorney, Agent, or Firm* — Dickinson Wright PLLC; Andrew D. Dorisio

(57) ABSTRACT

A method is for monitoring a ground resistance of an electric installation which consists of an ungrounded stationary alternating-voltage power supply system having at least one active conductor and of a consumer connected to the stationary alternating-voltage power supply system via a supply line. For this method, the already available active conductors of the stationary alternating-voltage power supply system and the leakage capacity of the leakage capacitor installed in the consumer are used to complete a measuring-current circuit for monitoring the ground resistance, a measuring signal being capacitively coupled between the active conductor and ground via a coupling circuit. Measuring currents and measuring voltages are measured when the consumer is switched on and off, a complex-valued load-side impedance, which has the ground resistance to be monitored in its real part, being detected from these measurements.

9 Claims, 7 Drawing Sheets

METHOD FOR MONITORING A GROUND RESISTANCE OF AN ELECTRIC INSTALLATION

This application claims priority to German Patent Application No. 10 2020 102 726.5, filed on Feb. 4, 2020, the disclosure of which is incorporated herein by reference.

FIELD OF THE INVENTION

The invention relates to a method for monitoring a ground resistance of an electric installation which consists of an ungrounded stationary alternating-voltage power supply system having at least one active conductor and of a consumer connected to the stationary alternating-voltage power supply system via a supply line.

BACKGROUND OF THE INVENTION

In the application surroundings observed, the ungrounded stationary alternating-voltage power supply system comprises at least one active conductor and is fed by a power transformer. The alternating-voltage power supply system can be a one or multiphase ungrounded power supply system and in addition can comprise a power converter (rectifier). The consumer preferably is connected to the alternating-voltage power supply system via a plug connection and a supply line and comprises a leakage capacitor connected to the protective conductor of the supply line.

To feed the electric operating means (consumers), the network configuration of an ungrounded power supply system, which is also referred to as an insulated network (French: isolé terre (IT)) or IT system, is used when higher requirements need to be fulfilled regarding operational, fire and contact safety. The active parts of this kind of power supply system are separated from the ground potential, i.e., ungrounded. The advantage of the ungrounded stationary alternating-voltage power supply system observed in this case is that the function of the electric operating means is not affected when a first insulation fault arises since a circuit cannot be completed in this first fault instance because of the ideally infinitely large impedance value between the active conductors of the network and ground.

If this ungrounded stationary alternating-voltage power supply system is connected to a consumer whose supply line has a protective conductor, it then has to be ensured that this protective conductor is properly connected to the ground potential and that the ground resistance of this protective-conductor connection does not exceed a predetermined resistance threshold.

As per its definition, the ground resistance is the sum of all resistances of the protective conductor in the supply line and the plug contacts or clamp connections.

The electric installation observed in this case can be a charging station for electric vehicles, for example, which is fed by the ungrounded stationary one or multiphase alternating-voltage power supply system. An electric energy storage (consumer) is connected to the charging station via a charging cable (supply line) by means of a charging plug system (plug connection). In the present case, it is presumed that the consumer is connected to the protective conductor of the supply line via a leakage capacitor.

In the event of the protective-conductor connection being faulty because of, for example, a broken line or faulty plug contacts, an increased risk of contact persists for people. Such faults of or damage to the protective conductor occur fairly commonly, wherefor detecting these faults prematurely by measuring the ground resistance is in the common interest.

An electrical circuit is always necessary for measuring the ground resistance. Such a completed circuit, however, cannot be realized in the insulated stationary alternating-voltage power supply system insulated against ground (ungrounded).

From the state of the art, specific supply lines are known which contain an additional conductor, often referred to as a pilot wire, control wire or monitoring wire, and solely serve for measuring the ground resistance in order to form a current loop in conjunction with the protective conductor. A loop resistance is measured which contains the ground resistance.

The known solutions have proven to be disadvantageous insofar as an individual conductor always has to be present in order to be able to complete an electrical circuit.

OBJECT AND SUMMARY OF THE INVENTION

The object of the invention at hand is therefore to propose a method for monitoring the ground resistance in an electric installation described above, the method requiring very little additional installation time or material and thus being implementable cost-efficiently.

The invention is based on the idea that the additional conductors known from the state of the art, such as the pilot wire or the individual control or monitoring wire, are omitted and instead the active conductor(s) already present in the stationary alternating-voltage power supply system and the leakage capacitance of the leakage capacitor installed in the consumer are used for completing a measuring circuit for monitoring a ground resistance.

No additional conductor is consequently required for completing a circuit since capacitive elements—the leakage capacitance of the consumer—are used as a circuit path. When the frequency is correspondingly high, the capacitive conductance value of these elements is sufficiently large to complete a circuit which comprises the ground resistance.

For this purpose, a measuring signal having a measuring frequency preferably ranging from approximately 80 Hz to 150 kHz is initially generated by means of a measuring-signal generator. In this frequency range, the (alternating-voltage) resistance of the leakage capacitor is neglectable and only the internal equivalent series resistance (ESR) of the leakage capacitors remains as the real resistance.

The measuring signal is capacitively coupled in the stationary alternating-voltage power supply system between the active conductor and ground via a coupling circuit having a coupling capacitor and a series resistance.

The coupling capacitor is chosen such that it also has a low (alternating-voltage) resistance in the cited frequency range from approximately 80 Hz to 150 kHz. The series resistance is a low-impedance resistance, preferably less than 1 Ohm, which serves as a shunt resistance of the current measurement, and can be taken into account as a predetermined known value for further measurements.

A first complex-valued measuring current which flows in the coupling circuit is measured when the consumer is switched off. This first measuring current flows in the measuring circuit which is completed to ground via the inevitably present internal capacitance of the power transformer.

At the same time as the first measuring current is measured, a first complex-valued measuring voltage is detected between the active conductor of the ungrounded stationary alternating-voltage power supply system and ground.

In accordance with Ohm's Law, a first complex-valued conductance value is determined from the first measuring current and the first measuring voltage.

In the next step, a second complex-valued measuring current is measured in the coupling path when the consumer is switched on. This second measuring current is composed of the first measuring current and a consumer current which flows via the leakage capacitance of the connected consumer.

At the same time as the second measuring current is measured, a second complex-valued measuring voltage is measured between the active conductor of the ungrounded stationary alternating-voltage power supply system and ground when the consumer is switched on.

In accordance with Ohm's Law, a second complex-valued conductance value is determined from the second measuring current and the second measuring voltage.

Subsequently, a complex-valued load-side conductance value is computed by forming the difference between the second conductance value and the first conductance value. This load-side conductance value can therefore be presented as a difference between the second conductance value and the first conductance value.

By inverting the load-side conductance value, a complex-valued load-side impedance is yielded.

This complex-valued load-side impedance comprises in its real part the ground resistance to be monitored. In order to be able to evaluate this ground resistance, a sum ground resistance is computed which is yielded by subtracting the series resistance and the equivalent series resistances of the leakage capacitor and the coupling capacitor from the real part of the complex-valued load-side impedance. Beside the ground resistance to be detected, the sum ground resistance further comprises the ohmic resistance of the supply line, albeit the ohmic resistance cannot be distinguished from the actual ground resistance while conducting the measurement. Hence, should the sum ground resistance exceed a predetermined ground-resistance threshold, it must be assumed, if need be, that the ground resistance is too large and a corresponding alarm is issued.

In another embodiment, the first and second measuring current are measured by means of a voltage drop at the series resistance and a current measuring circuit parallel to the series resistance.

The current measuring circuit is realized as a high-pass filter having a current measuring capacitor and a current measuring resistance.

The first and second measuring voltage are detected by conducting a measurement by means of a capacitive voltage measuring circuit.

The voltage measuring circuit is also realized as a high-pass filter having a voltage measuring capacitor and a voltage measuring resistance.

Alternatively to conducting a measurement to detect the first and second measuring voltage, the first and second measuring voltage can be determined by using a known measuring-signal generator voltage of the measuring-voltage generator.

Preferably, the first conductance value and the second conductance value are determined by computing Fourier coefficients of the measuring frequency of the first and second measuring current and the first and second measuring voltage.

When applying the method in a three-phase ungrounded stationary alternating-voltage power supply system, the measuring signal is coupled in such a manner by means of the coupling circuit that a coupling capacitor is switched in the coupling circuit for each active conductor and the coupling circuit has the series resistance as a shared coupling resistance.

Consequently, the parallel circuit of three coupling capacitors, which are connected to a shared coupling resistance, is yielded in a three-phase ungrounded stationary alternating-voltage power supply system.

Furthermore when applying the method in a three-phase ungrounded stationary alternating-voltage power supply system having a power converter, the sum ground resistance is computed by additionally subtracting differential diode resistances of the power converter and the equivalent series resistances from power-converter leakage capacitors.

Advantageously, the measuring frequency is switched between two measuring frequencies.

In particular in the instance of the installed rectifier, the capacitances of the power-converter leakage capacitors can be computationally eliminated by conducting a measurement with two different frequencies.

BRIEF DESCRIPTION OF DRAWINGS

Further advantageous embodiment features are derived from the following description and the drawings which describe preferred embodiments of the invention using examples.

DETAILED DESCRIPTION

Figure 1:
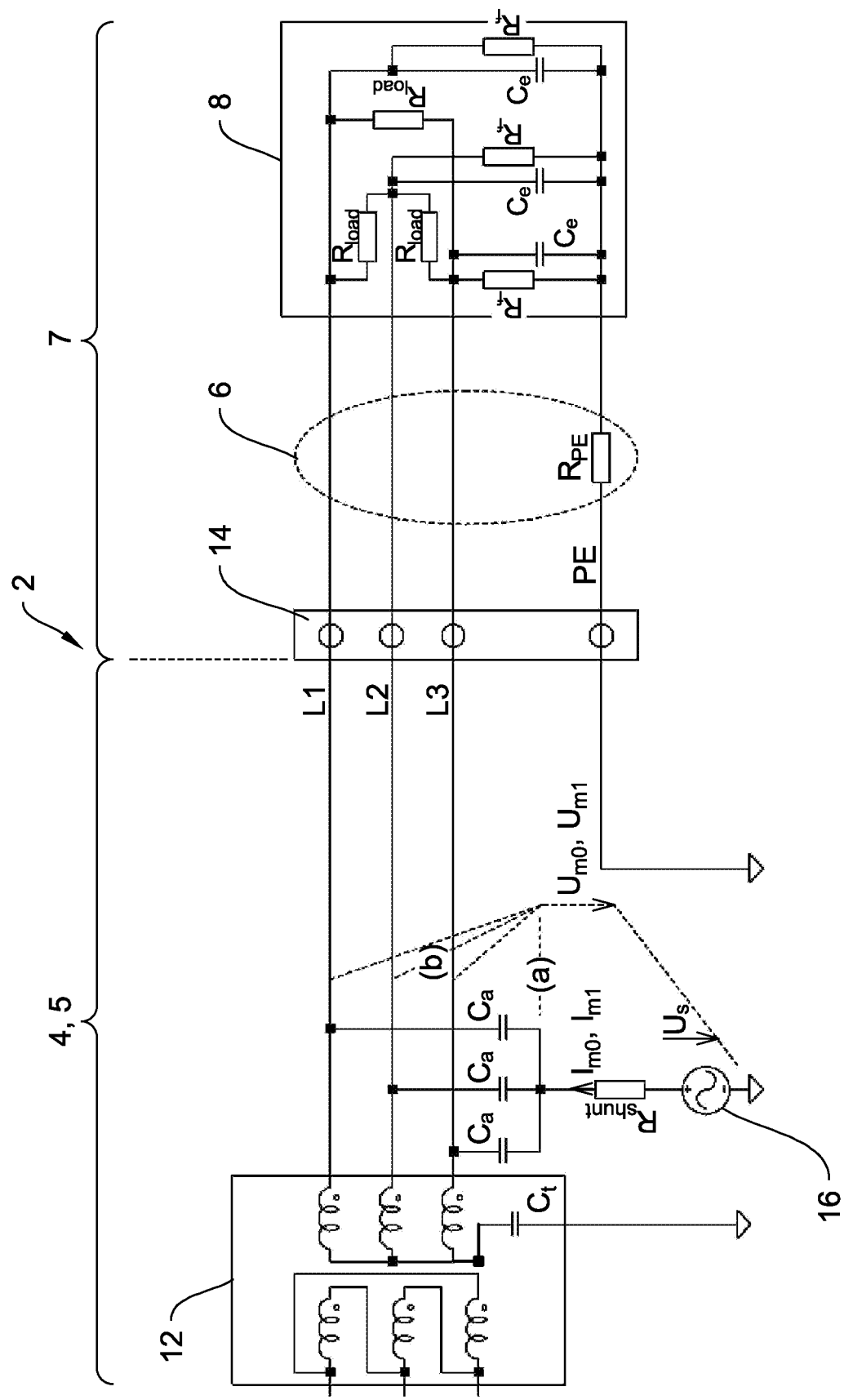
FIG. 1 shows an application of the method according to the invention in a three-phase alternating-voltage power supply system having a connected consumer.

FIG. 1 shows an exemplary application of the method according to the invention for monitoring a ground resistance $R_{PE}$ for an electric installation 2. Electric installation 2 consists of a three-phase ungrounded stationary alternating-voltage power supply system 4 having three active conductors L1, L2, L3 and a consumer 8 connected to stationary alternating-voltage power supply system 4 via a plug connection 14 and a supply line 6.

Electric installation 2 can be subdivided into a stationary part 5 comprising stationary alternating-voltage power supply system 4 and a temporary part 7 comprising plug connection 14, supply line 6 and consumer 8.

Stationary alternating-voltage power supply system 4 is fed by a transformer 12 whose coils each have an internal capacity $C_t$ to ground.

Consumer 8 is characterized by load resistances $R_{load}$. It is mandatory for consumer 8 to comprise a commonly present leakage capacitor $C_e$ to ground for each phase corresponding to active conductors L1, L2, L3. Furthermore, insulation resistances $R_f$ are illustrated which are connected parallel to leakage capacitors $C_e$ and have a sufficiently high impedance in this instance, for which reason they can be neglected in further observations.

The task at hand is to monitor ground resistance $R_{PE}$ of protective conductor PE in order to be able to detect in due time whether a line of protective conductor PE has broken or a plug connection 14 is faulty. Ground resistance $R_{PE}$ is assigned as a concentrated element of supply line 6 although it does comprise, as per its definition described above, the resistance of protective conductor PE in supply line 6, a resistance of plug connection 14 and possible resistances of additional clamp connections.

According to the invention, ground resistance $R_{PE}$ is monitored without requiring an additional signal line. For this purpose, a measuring signal $U_s$ having a measuring frequency ranging from approximately 80 Hz to 150 Hz is initially generated in a measuring-signal generator 16. Measuring signal $U_s$ is capacitively coupled between each active conductor L1, L2, L3 and ground via a coupling circuit which consists of leakage capacitors $C_a$ and series resistance $R_{shunt}$. As a result, a measuring-current circuit is completed for a first measuring current $I_{m0}$ solely via internal capacitance $C_t$ of transformer 12 supplying current when the consumer is switched off. In the case of connected consumer 8, a second measuring current $I_{m1}$ is yielded which has a consumer current $I_v$ (FIG. 2) in addition to first measuring current $I_{m0}$, consumer current $I_v$ flowing via leakage capacitors $C_e$ installed in consumer 8 and ground resistance $R_{PE}$.

Figure 2:
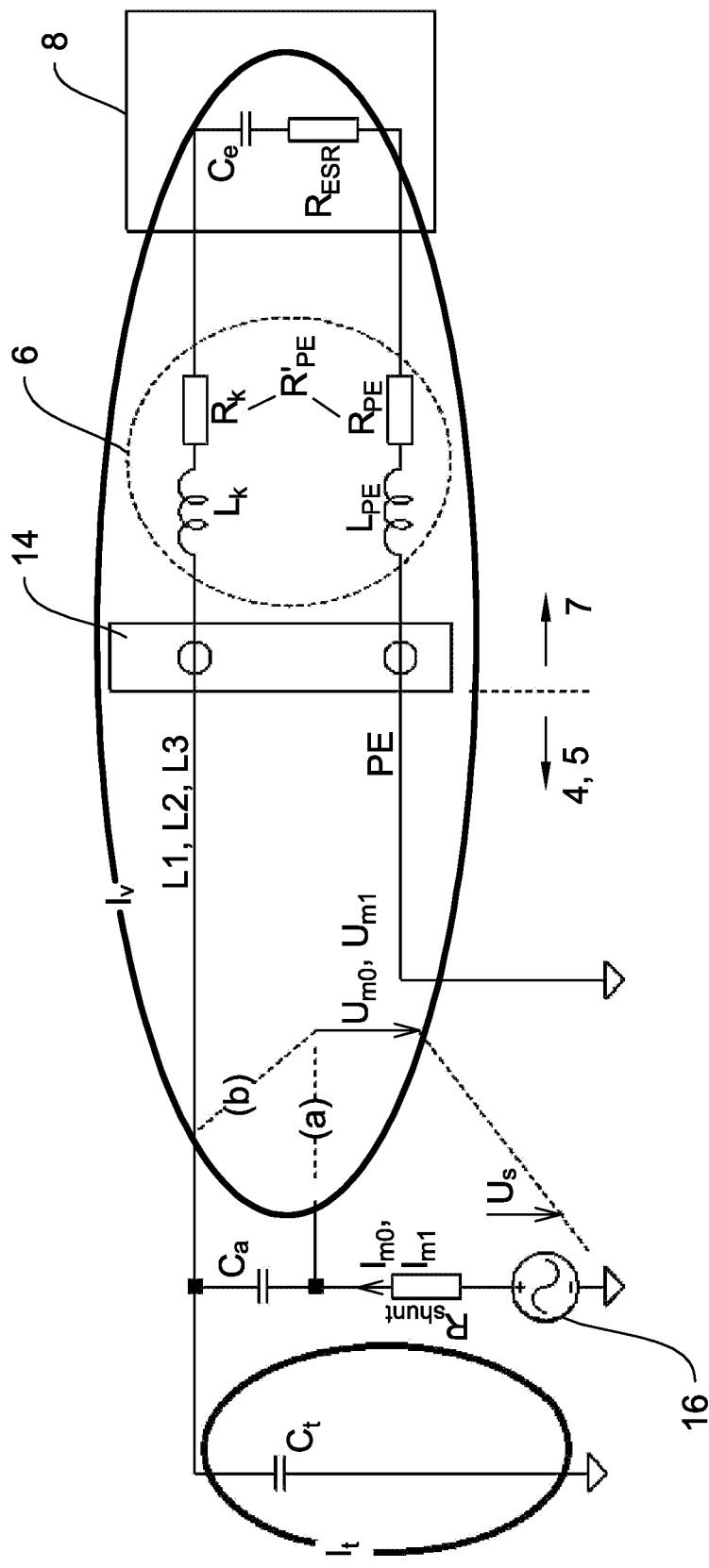
FIG. 2 shows an electric equivalent circuit diagram according to FIG. 1.

FIG. 2 shows an equivalent circuit diagram of the constellation depicted in FIG. 1 to clarify in which manner the current of the first and second measuring current $I_{m0}$, $I_{m1}$ flows and a first and a second measuring voltage $U_{m0}$, $U_{m1}$ is measured.

To simplify the drawing, active conductors L1, L2, L3 are illustrated as a single active conductor. High-impedance insulation resistances $R_f$ are neglectable.

If the consumer is switched off or not connected while at least one internal capacitance $C_t$ is present in transformer 12, a transformer current $I_t$, which is driven by measuring signal $U_s$ and corresponds to first measuring current $I_{m0}$, flows in stationary part 5. Additional high-impedance insulation resistances parallel to internal capacitance $C_t$ on the other hand are neglectable. Other intentionally installed leakage capacitors in the stationary part act in the same manner as internal capacitance $C_t$.

In the event that a consumer is switched on, the consumer current $I_v$ flowing through temporary part 7 is limited by series resistance $R_{shunt}$, coupling capacitor $C_a$ or the parallel connection of three coupling capacitors $C_a$ when the network is a three-phase network, equivalent series resistance $R_{ESR}$ of coupling capacitor $C_a$, a (supply) line inductivity $L_k$ of the supply line, ohmic resistance $R_k$ of the supply line, including the contact resistances of possibly present plug connection 14, leakage capacitor $C_e$ of consumer 8 or the shunt circuit of all leakage capacitors $C_e$ in the consumer, the equivalent series resistances of leakage capacitors $C_e$ in the consumer, inductivity $L_{PE}$ of protective conductor PE in supply line 6, and ground resistance $R_{PE}$ of protective conductor PE, including the corresponding contact resistance of a possibly present plug connection 14.

Under a high frequency of measuring signal $U_s$, the conductance value of leakage capacitors $C_a$ and the capacitive conductance value of the transformer coil become so large that a first measuring current $I_{m0}$ (when the consumer is switched off) driven by measuring signal $U_s$ and a sufficiently large second measuring current $I_{m1}$ (when the consumer is switched on) flow, both of which are suitable for measuring ground resistance $R_{PE}$.

In conjunction with the measurements of the first measuring voltage $U_{m0}$ for a switched-off consumer and the second measuring voltage $U_{m1}$ for a switched-on consumer, a first conductance value $Y_{m0}$, which corresponds to transformer-side conductance value $Y_t$ and is assigned to transformer current $I_t=I_{m0}$, i.e., first measuring current $I_{m0}$, and a second conductance value $Y_{m1}$, which is assigned to second measuring current $I_{m1}$ can now be determined. By forming a difference between second conductance value $Y_{m1}$ and first conductance value $Y_{m0}$, complex-valued load-side conductance value $Y_v$ is obtained.

Measurement without the consumer:

$$Y_{m0}=Y_t$$

Measurement with the consumer:

$$Y_{m1}=Y_t+Y_v$$

$$Y_v=Y_{m1}-Y_{m0}$$

By forming the inverse of load-side conductance value $Y_v$, complex-valued load-side impedance $Z_v$ is obtained whose real part contains ground resistance $R_{PE}$.

The imaginary part of load-side impedance $Z_v$ plays no further role in further observations.

The real part of load-side impedance $Z_v$, however, comprises all ohmic portions, i.e., all equivalent series resistances, series resistance $R_{shunt}$ and the differential resistance (resistance load per unit length 60) (cf. FIG. 3) in addition to ground resistance $R_{PE}$ to be monitored, and therefore must be subtracted from the real part of load-side impedance $Z_v$.

Since the values of equivalent series resistances $R_{ESR}$ are minute, the information from data sheets suffices for their subtraction. Series resistance $R_{shunt}$ is a resistance having predetermined, precisely known value.

Consequently, a sum ground resistance $R'_{PE}$ remains which consists of the sum of (supply) line resistance $R_k$ and (actual) ground resistance $R_{PE}$. There is no measurable difference between line resistance $R_k$ and ground resistance $R_{PE}$. If the sum ground resistance $R'_{PE}$ exceeds a ground-resistance threshold $R_{PElim}$, it must be assumed, if need be, that ground resistance $R_{PE}$ is inadmissibly large and a corresponding alarm is issued or the system must be shut down.

Determining complex-valued conductance values $Y_{m0}$, $Y_{m1}$, $Y_v$ requires current measurements and voltage measurements having defined phasing. Current is measured via a measuring resistance $R_{shunt}$ (shunt resistance) as a current sensor. A broadband amplifier A1 (FIG. 5) switched downstream has to be designed so as to be broadband so that its output signal only has a minuscule reflection phase change in comparison to each actual phasing of real currents $I_{m0}$, $I_{m1}$.

The tapping of first and second complex-valued measuring voltage $U_{m0}$, $U_{m1}$ between active conductors L1, L2, L3 and ground can lead directly to active conductors L1, L2, L3 via measuring path (b) or via measuring path (a) which avoids a direct coupling to active conductors L1, L2, L3, albeit the measuring precision deteriorates in measuring path (a) as an additional voltage drops at coupling capacitor $C_a$.

Generally, first and second measuring voltage $U_{m0}$, $U_{m1}$ do not have to be measured if measuring-signal generator 16 generates a stable known output amplitude at differing loads and if the generated output signal is consistently in a fixed or known phase relationship to a differently generated phase reference. In this case, a known measuring-signal generator voltage can replace measuring first and second measuring voltage $U_{m0}$, $U_{m1}$.

Via integration over at least one period of measured measuring currents $I_{m0}$, $I_{m1}$ and measured measuring voltages $U_{m0}$, $U_{m1}$, their Fourier coefficients can be determined and from there first conductance value $Y_{m0}$ (with a switched-off consumer) and second conductance value $Y_{m1}$ (with a switched-on consumer) can be computed.

Measurement without the consumer:

$$Y_{m0} = \frac{F\{I_{m0}\}}{F\{U_{m0}\}}$$

Measurement with the consumer:

$$Y_{m1} = \frac{F\{I_{m1}\}}{F\{U_{m1}\}}$$

The forming of a difference results in load-side conductance value $Y_v$
$Y_v = Y_{m1} - Y_{m0}$ and forming the inverse results in $$Z_v = \frac{1}{Y_v}$$

as the real part $R_k R_{PE} = Re\{Z_v\} - R_{shunt} \text{ESR\_Werte}$

This real part corresponds to sum ground resistance $R'_{PE}$. The imaginary part can take on any value and is not evaluated.

When computing the Fourier coefficients, it is presumed that the cosine function and the sine function orthogonal thereto and having an internal phase reference are present. Alternatively, vector lock-in amplifiers can be used.

FIG. 2 can also be used as an equivalent circuit diagram should additional capacitances become effective by switching on consumer 8, the additional capacitances bridging the current path, consisting of a supply line 6, a possibly available plug connection 14 and leakage capacitor $C_e$, in a series circuit. This would be the case, for example, if a plug connection 14 has a radio interference suppression capacitor.

Figure 3:
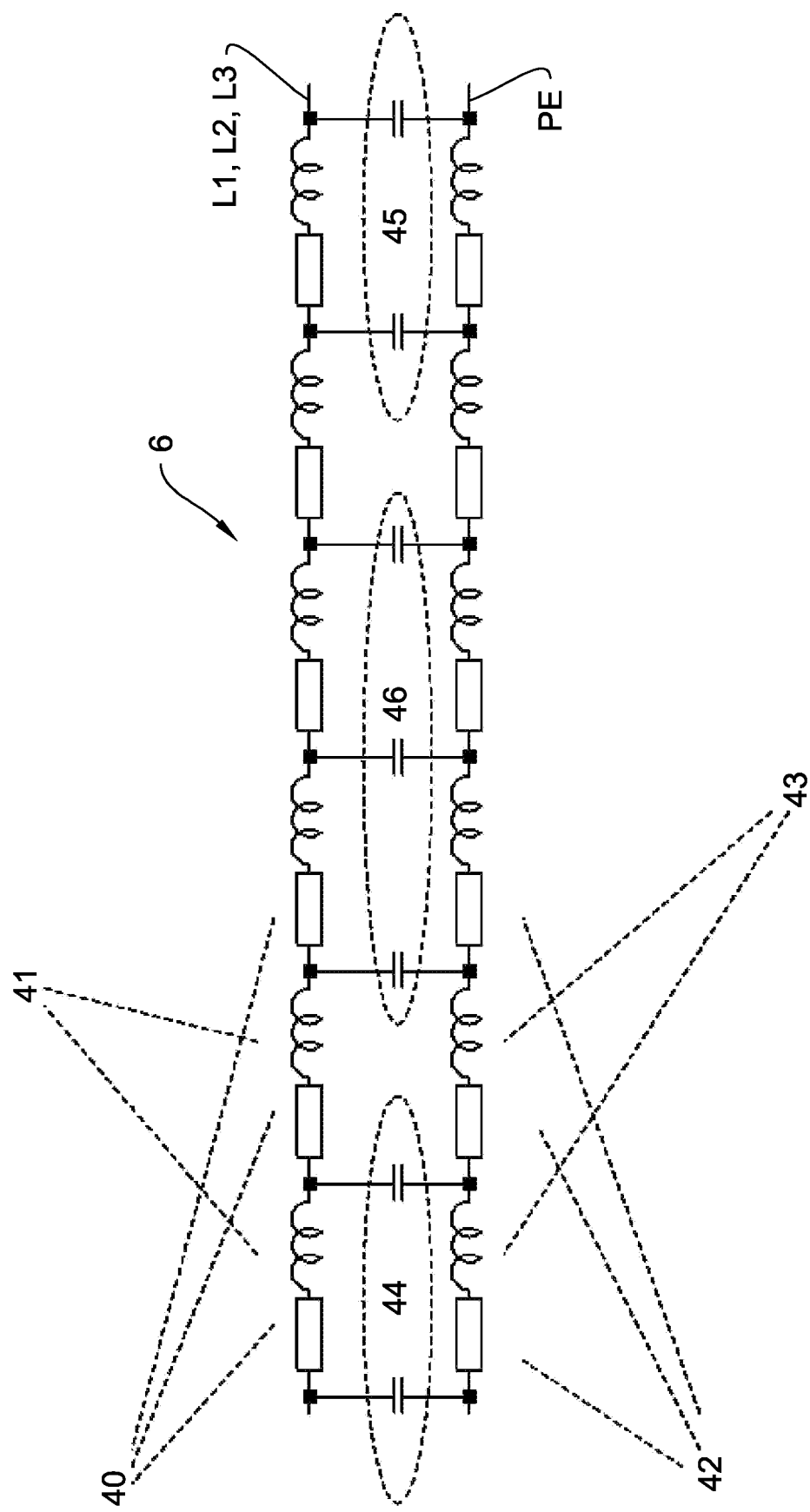
FIG. 3 shows a cable model of the supply line having distributed line elements.

FIG. 3 shows a cable model of supply line 6 having distributed line elements 40 to 46.

Line capacitances acting on the output side can be seen as series circuits of leakage capacitors $C_e$ and have the same effect as they do. But seeing as ohmic, capacitive and inductive resistances are continuously (and differentially) distributed via the line (resistance per unit length, capacitance per unit length, inductance per unit length), measurement errors cannot be precluded.

All differential resistances 40 (resistance per unit length) of active conductors L1, L2, L3 are components of line resistance $R_k$ and play a role in the measurement result. Differential inductivities 41 (inductivity per unit length) of active conductors L1, L2, L3 are components of line inductivity $L_k$ and can be ignored as they are part of the imaginary part of load-side impedance $Z_v$. The same applies to differential resistances 42 of protective conductor PE and to differential inductivities 43 of protective conductor PE.

Differential capacitances 44 which appear on the input side of supply line 6 can be eliminated in a measuring method having two frequencies. Differential capacitances 45 which appear on the output side of supply line 6 can be deemed a good approximation of a parallel circuit to leakage capacitances $C_e$ and yield only minute measuring errors. Differential capacitances 46 which can be assigned to the middle area of supply line 6 counteract a loop measurement and can also yield measuring errors.

Figure 4:
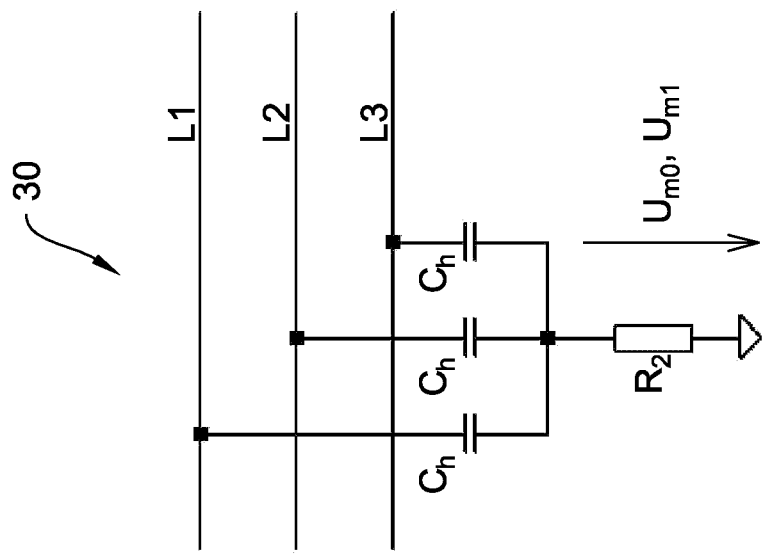
FIG. 4 shows a capacitive voltage measuring circuit.

FIG. 4 shows in which manner first and second measuring voltage $U_{m0}$, $U_{m1}$ are measured in a three-phase ungrounded stationary alternating-voltage power supply system 4 by means of a capacitive voltage measuring circuit 30.

The depicted voltage tap corresponds to measuring path (b) in FIGS. 1 and 2. Voltage measuring circuit 30 is realized as a high-pass filter having a voltage measuring capacitor $C_h$ for each active conductor L1, L2, L3, voltage measuring capacitors $C_h$ being grounded via a shared voltage measuring resistance $R_2$. First and second measuring voltage $U_{m0}$, $U_{m1}$ are tapped via voltage measuring resistance $R_2$.

Figure 5:
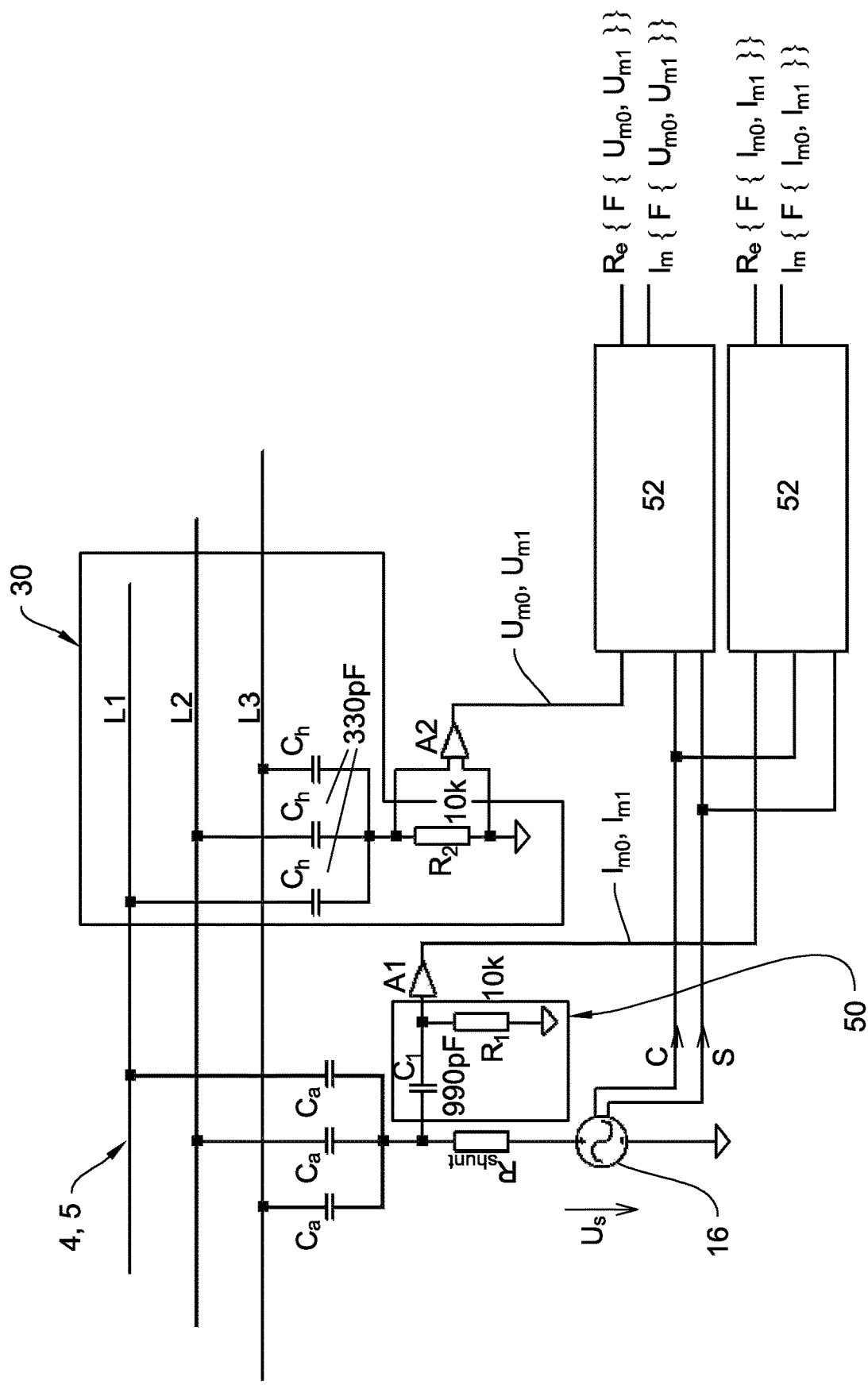
FIG. 5 shows a coupling of the measuring signal and a current measuring circuit and a voltage measuring circuit having analogous signal processing.

FIG. 5 shows a coupling of measuring signal $U_s$ as well as a current measuring circuit 50 and a voltage measuring circuit 30 having analog signal processing in a three-phase ungrounded stationary alternating-voltage power supply system 4.

Measuring signal $U_s$ generated by measuring-signal generator 16 reaches active conductors L1, L2, L3 of alternating-voltage power supply system 4 via series resistance $R_{shunt}$ and coupling condensers $C_a$.

First and second measuring current $I_{m0}$, $I_{m1}$ are measured via a current measuring circuit 50, which advantageously is realized as a high-pass filter for suppressing network voltage. A voltage tapped via series resistance $R_{shunt}$ serves as an input signal for this high-pass filter. The high-pass filter comprises a current measuring condenser $C_1$ and a current measuring resistance $R_1$. The output signal of the high-pass filter is forwarded to broadband amplifier A1 as first or second measuring current $I_{m0}$, $I_{m1}$.

First and second measuring voltage $U_{m0}$, $U_{m1}$ are measured according to the capacitive voltage measuring circuit which is illustrated in FIG. 4 and is also realized as a high-pass filter having voltage measuring condensers $C_h$ and voltage measuring resistance $R_2$.

It is observed that the corresponding time constant of both high-pass filters 30, 50 is the same—$C_1$ has a capacitance of 990 pF which corresponds to the capacitance of the three voltage measuring condensers $C_h$ connected in series which each have a capacitance of 330 pF. Current measuring resistance $R_1$ and voltage measuring resistance $R_2$ have the same value of 10 kΩ. Since the time constants are the same, the phase change is also the same. A difference in the phase change, however, is admissible as long as it was detected within the scope of a calibration.

A broadband difference amplifier A2 amplifies first and second measuring voltage $U_{m0}$, $U_{m1}$.

First and second measuring voltage $I_{m0}$, $I_{m1}$ and first and second measuring voltage $U_{m0}$, $U_{m1}$ are each processed using a vector lock-in amplifier 52 for computing the Fourier coefficients. At the outputs of corresponding vector lock-in amplifiers 52, the real part and the imaginary part of first and second measuring current $I_{m0}$, $I_{m1}$ and first and second measuring voltage $U_{m0}$, $U_{m1}$ are available.

Further evaluation takes place in a digital computing unit (not illustrated) via an analog-to-digital converter (not illustrated). Measuring-signal generator 16 is equipped with synchronous orthogonal digital outputs C, S which are used as phase inputs of vector lock-in amplifier 52.

Figure 6:
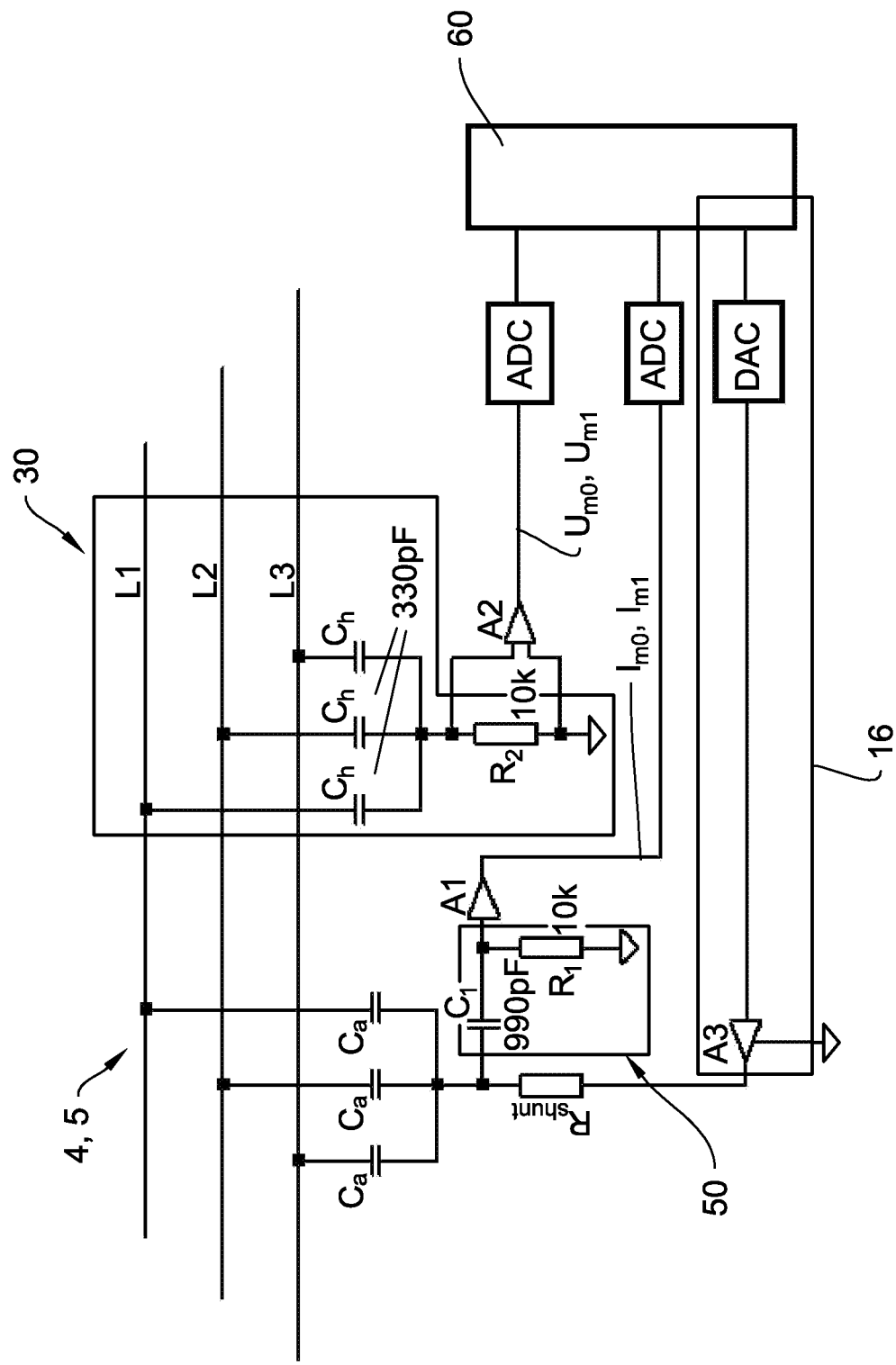
FIG. 6 shows a coupling of the measuring signal and a current measuring circuit and a voltage measuring circuit having digital signal processing.

FIG. 6 shows the coupling of measuring signal $U_s$ and a current measuring circuit 50 and a voltage measuring circuit 30 having digital signal processing in a three-phase ungrounded stationary alternating-voltage power supply system 4.

Unlike the analog signal processing illustrated in FIG. 5, the output signals—first and second measuring voltage $U_{m0}$, $U_{m1}$ of voltage measuring circuit 30 and first and second measuring current $I_{m0}$, $I_{m1}$ of current measuring circuit 50—are subjected to an analog-to-digital conversion ADC and are supplied to a computing unit 60 after having been amplified via corresponding broadband amplifier A2, A1. The Fourier coefficients can be computed with an improved selectivity in this computing unit 60 by using cosine and sine values instead of digital square signals C and S (FIG. 5). Measuring-signal generator 16 is realized having a digital-to-analog converter DAC and a performance level A3.

Figure 7:
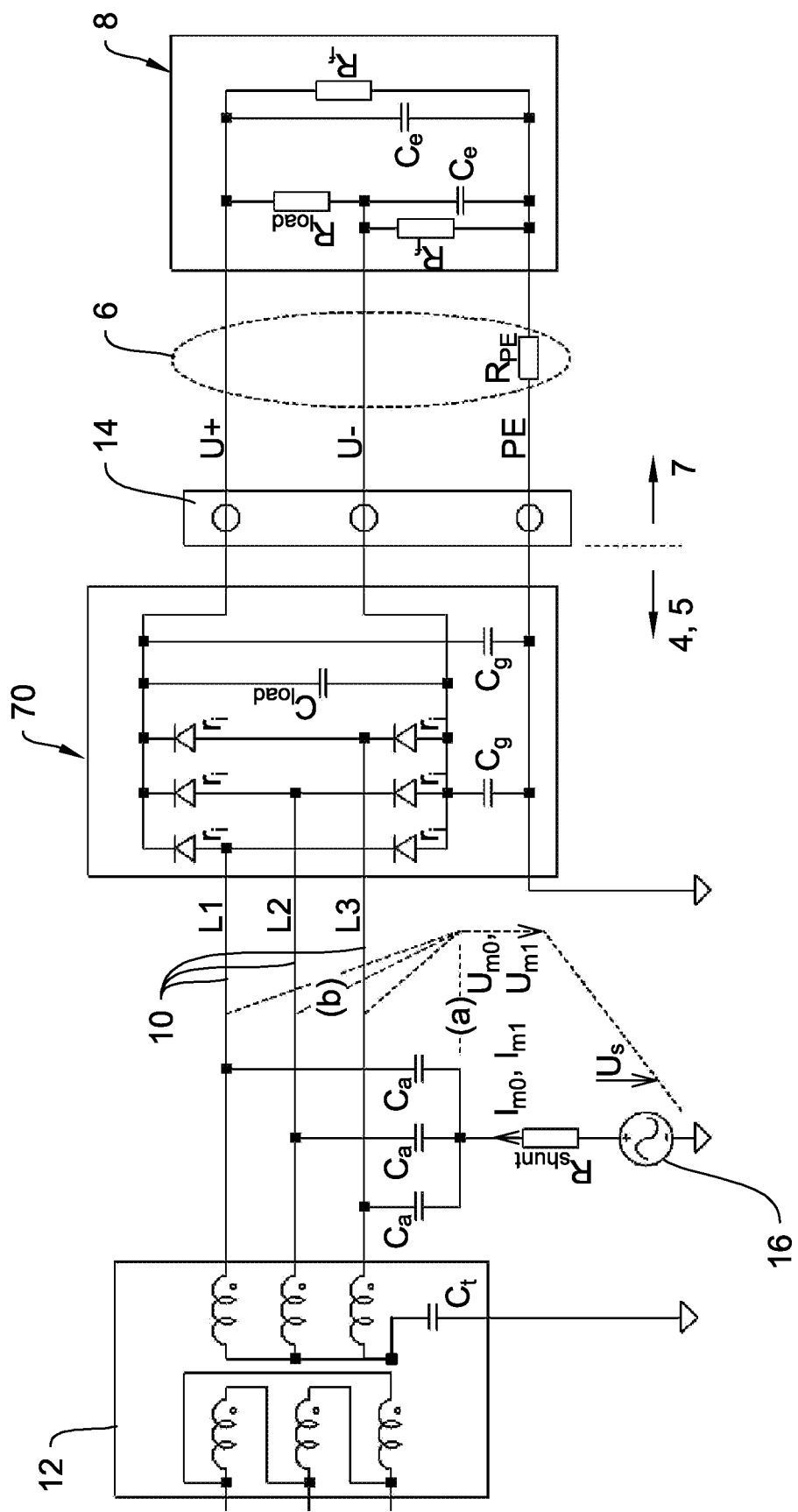
FIG. 7 shows an application of the method according to the invention in a three-phase alternating-voltage power supply system having a rectifier.

FIG. 7 shows an application of the method according to the invention in a three-phase ungrounded stationary alternating-voltage power supply system 4 having a rectifier 70.

This constellation corresponds to a charging station (stationary area 5 having three-phase ungrounded stationary alternating-voltage power supply station 4) with an electric vehicle hooked-up (temporary area 7 having a charging plug and a charging socket as a plug connection 14, a charging cable as a supply line 6 and an electric energy storage as a consumer 8).

Rectifier 70 is realized as a B6-rectifier, differential resistance $r_i$ of the diodes having to be taken into consideration when consumer 8 is switched on:

$$R_k R_{PE} = Re\{Z_v\} - R_{shunt} - r_i ESR\_Werte$$

However, differential resistance $r_i$ of the diodes also depends on the conduction angle of the diodes. The conduction angle is determined by a charging capacitor $C_{load}$ and consumer load $R_{load}$. The measurement becomes more precise, the smaller $C_{load}$ is, and the consumer current is so large that differential resistance $r_i$ remains small.

Possibly available rectifier leakage capacitors $C_g$ can be eliminated via measurements having two different measuring frequencies and an evaluation computation.

The invention claimed is:

1. A method for monitoring a ground resistance ($R_{PE}$) of an electric installation (2) which consists of an ungrounded stationary alternating-voltage power supply system (4) having at least one active conductor (L1, L2, L3) and of a consumer (8) connected to the stationary alternating-voltage power supply system (4) via a supply line (6), the ungrounded stationary alternating-voltage power supply system (4) being supplied by a power transformer (12) and the consumer (8) comprising a leakage capacitor ($C_e$) connected to a protective conductor (PE), the method comprising the following steps:
    generating a measuring signal ($U_s$) having a measuring frequency by means of a measuring-signal generator (16),
    capacitively coupling the measuring signal ($U_s$) in the stationary alternating-voltage power supply system (4) between the active conductor (L1, L2, L3) and ground via a coupling circuit having a coupling capacitor ($C_s$) and having a series resistance ($R_{shunt}$), measuring a complex-valued first measuring current ($I_{m0}$) in the coupling circuit when the consumer (8) is switched off,
    detecting a complex-valued first measuring voltage ($U_{m0}$) between the active conductor (L1, L2, L3) and ground when the consumer (8) is switched off,
    determining a first complex-valued conductance value ($Y_{m0}$) from the first measuring current ($I_{m0}$) and the first measuring voltage ($U_{m0}$),
    measuring a second complex-valued measuring current ($I_{m1}$) in the coupling path when the consumer (8) is switched on,
    measuring a second complex-valued measuring voltage ($U_{m1}$) between the active conductor (L1, L2, L3) and ground when the consumer (8) is switched on,
    determining a second complex-valued conductance value ($Y_{m1}$) from the second measuring current ($I_{m1}$) and the second measuring voltage ($U_{m1}$),
    computing a complex-valued load-side conductance value ($Y_v$) by forming a difference between the second conductance value ($Y_{m1}$) and the first conductance value ($Y_{m0}$),
    computing a complex-valued load-side impedance ($Z_v$) from the inverse of the load-side conductance value ($Y_v$),
    computing a sum ground resistance ($R'_{PE}$) by subtracting the series resistance ($R_{shunt}$) and loss resistances ($R_{ESR}$) of the leakage capacitor ($C_e$) and the coupling capacitor ($C_a$) from the real part of the complex-valued load-side impedance ($Z_v$),
    generating an alarm signal if the sum ground resistance ($R'_{PE}$) exceeds a ground resistance threshold ($R_{PE1im}$).

2. The method according to claim 1, wherein the first and second measuring current ($I_{m0}$, $I_{m1}$) are measured by tapping voltage at the series resistance ($R_{shunt}$) and at a current measuring circuit (50) which is parallel to the series resistance ($R_{shunt}$) and is realized as a high-pass filter having a current measuring capacitor ($C_1$) and a current measuring resistance ($R_1$).

3. The method according to claim 1, wherein the first and second measuring voltage ($U_{m0}$, $U_{m1}$) are detected by conducting a measurement by means of a capacitive voltage measuring circuit (30) which is realized as a high-pass filter having a voltage measuring capacitor ($C_h$) and a voltage measuring resistance ($R_2$).

4. The method according to claim 1, wherein the first and second measuring voltage ($U_{m0}$, $U_{m1}$) are detected by using a known measuring-signal generator voltage of the measuring-signal generator (16).

5. The method according to claim 1, wherein the first conductance value ($Y_{m0}$) and second conductance value ($Y_{m1}$) are determined by computing Fourier coefficients (F{ }) of the first and second measuring current ($I_{m0}$, $I_{m1}$) and the first and second measuring voltage ($U_{m0}$, $U_{m1}$).

6. The method according to claim 1, wherein, when the method is applied in a 3-phase ungrounded stationary alternating-voltage power supply system (4), the measuring signal ($U_s$) is coupled in such a manner by means of the coupling circuit that a coupling capacitor ($C_a$) is switched in the coupling circuit for each active conductor (L1, L2, L3) and that the coupling circuit has the series resistance ($R_{shunt}$) as a shared coupling resistance.

7. The method according to claim 1, wherein, when the method is applied in a 3-phase ungrounded stationary alternating-voltage power supply system (4) with a power converter (70), the sum ground resistance ($R'_{PE}$) is computed by additionally subtracting differential diode resistances ($r_i$) of the power converter (70) and the loss resistances of power-converter leakage capacitors ($C_g$).

8. The method according to claim 1, wherein the measuring frequency is switched between two measuring frequencies.

9. The method according to claim 1, wherein the measuring frequency of the measuring signal ($U_s$) preferably ranges from 80 Hz to 150 kHz.

* * * * *